United States Patent
Sussek

(10) Patent No.: US 9,469,288 B2
(45) Date of Patent: Oct. 18, 2016

(54) METHOD FOR DETERMINING A TRIGGERING CONDITION FOR RECALIBRATION OF AN AUTOMATIC PARKING BRAKE

(71) Applicant: Robert Bosch GmbH, Stuttgart (DE)

(72) Inventor: Ullrich Sussek, Oberstenfeld (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/615,569

(22) Filed: Feb. 6, 2015

(65) Prior Publication Data

US 2015/0217750 A1    Aug. 6, 2015

(30) Foreign Application Priority Data

Feb. 6, 2014    (DE) .................. 10 2014 202 152

(51) Int. Cl.
| | |
|---|---|
| *B60T 17/22* | (2006.01) |
| *B60T 13/58* | (2006.01) |
| *B60T 13/74* | (2006.01) |
| *F16D 55/226* | (2006.01) |
| *F16D 65/18* | (2006.01) |
| *G01R 31/34* | (2006.01) |
| *F16D 121/04* | (2012.01) |
| *F16D 121/14* | (2012.01) |

(52) U.S. Cl.
CPC ............ *B60T 17/221* (2013.01); *B60T 13/588* (2013.01); *B60T 13/741* (2013.01); *B60T 13/746* (2013.01); *B60T 17/22* (2013.01); *F16D 55/226* (2013.01); *F16D 65/18* (2013.01); *G01R 31/34* (2013.01); *F16D 2121/04* (2013.01); *F16D 2121/14* (2013.01)

(58) Field of Classification Search
None
See application file for complete search history.

(56) References Cited

U.S. PATENT DOCUMENTS

| | | | | |
|---|---|---|---|---|
| 7,185,745 | B2* | 3/2007 | Godlewsky | F16D 65/18 188/1.11 E |
| 7,992,691 | B2* | 8/2011 | Maron | B60T 13/588 188/156 |
| 8,521,388 | B2* | 8/2013 | Baehrle-Miller | B60T 7/042 701/70 |
| 8,996,270 | B2* | 3/2015 | Bieltz | B60T 13/746 188/156 |
| 9,031,756 | B2* | 5/2015 | Baehrle-Miller | B60T 7/042 701/70 |
| 9,205,814 | B2* | 12/2015 | Yabuguchi | B60T 7/02 |
| 2005/0035653 | A1* | 2/2005 | Godlewsky | F16D 65/18 303/122.03 |
| 2010/0308645 | A1* | 12/2010 | Maron | B60T 13/588 303/20 |
| 2011/0224880 | A1* | 9/2011 | Baehrle-Miller | B60T 7/042 701/70 |
| 2013/0056315 | A1* | 3/2013 | Bieltz | B60T 7/042 188/106 P |
| 2013/0338896 | A1* | 12/2013 | Baehrle-Miller | B60T 7/042 701/70 |
| 2014/0058642 | A1* | 2/2014 | Bieltz | B60T 13/746 701/70 |
| 2014/0156141 | A1* | 6/2014 | Yabuguchi | B60T 7/02 701/36 |
| 2015/0217743 | A1* | 8/2015 | Blattert | B60T 7/122 701/70 |
| 2015/0239439 | A1* | 8/2015 | Sussek | B60T 8/171 701/70 |

FOREIGN PATENT DOCUMENTS

DE    10 2011 004 763 A1    8/2012

* cited by examiner

*Primary Examiner* — Yonel Beaulieu
*Assistant Examiner* — Krishnan Ramesh
(74) *Attorney, Agent, or Firm* — Maginot, Moore & Beck LLP

(57) ABSTRACT

A method for determining a triggering condition for recalibration in an automatic parking brake includes determining a motor current which is expected at a predetermined time during a release process of the automatic parking brake. The method includes identifying motor current for a brake motor in the automatic parking brake that generates an electromechanical braking force during operation and releases the electromechanical braking force during the release process.

6 Claims, 3 Drawing Sheets

METHOD FOR DETERMINING A TRIGGERING CONDITION FOR RECALIBRATION OF AN AUTOMATIC PARKING BRAKE

This application claims priority under 35 U.S.C. §119 to patent application no. DE 10 2014 202 152.9 filed on Feb. 6, 2014 in Germany, the disclosure of which is incorporated herein by reference in its entirety.

The disclosure relates to a method for determining a triggering condition for recalibration, and to an open-loop and/or closed-loop control unit and to an automatic parking brake system.

BACKGROUND

A method for recalibrating an automatic parking brake in a motor vehicle is known from DE 10 2011 004 763 A1. Recalibration is performed when a fault occurs during a release process of the parking brake. A fault can result, for example, from a voltage dip in the on-board power system of the motor vehicle. A fault can also occur when the driver attempts to drive away even though the brake is still not (fully enough) opened and the release process consequently is not terminated. In the case of a fault, the brake motor is usually firstly switched off. If appropriate, a hydraulic assistance is requested and the brake motor is subsequently started again in order to continue the triggering process of the brake piston before starting the actual recalibration, to such an extent until the clamping force generated by the parking brake is eliminated and the parking brake consequently operates free of loading in the no-load mode.

In addition to the abovementioned cases, the recalibration is also started when a release process of the automatic parking brake runs in a load-free fashion. A load-free release process occurs when the motor current drops to its no-load level directly after the switch-on peak. The release process is aborted in this case because the position of the spindle nut can no longer be determined reliably. The recalibration process runs in two steps after the aborting of the release process. Firstly, the brake linings are moved to the brake disks by means of corresponding activation of the brake motor. The application of the brake linings to the brake disks is detected by a rise in the motor current. Subsequent to this, the automatic parking brake is opened in a manner known per se. The recalibration process is therefore ended. After the recalibration, the automatic parking brake is therefore in the open state and the closing process can be started again manually or automatically.

It is disadvantageous with the known recalibration methods in the case of a load-free release process that, at the time of checking, referred to below as a predetermined time, as to whether the motor current is in the load-free state, only one motor current which is present at this predetermined time is compared with an assumed threshold value in order to carry out the check. The current which is picked up by the brake motor is therefore measured after a predetermined time after the start of the release process and compared with the threshold value. If the measured current is below the threshold value at the predetermined time, a load-free release is assumed and the recalibration is started. However, this fails to take into account that the resulting current profile results from a superimposition of the switch-on current surge and the force elimination curve. The force elimination curve is also influenced substantially by a hydraulic admission pressure which is generated by the driver. Furthermore, the length of the switch-on current surge of the motor depends on a plurality of parameters, in particular the temperature, the mechanical time constants of the motor and cabling. It is therefore possible, for example by means of a large time constant of the brake motor and a high motor voltage, for incorrect interpretation of a motor current switch-on peak as a force elimination curve even though a release occurs without the elimination of force. In order to be able to reliably detect the state of the load-free release at the predetermined time even in such situations, the threshold value must be correspondingly raised, as a result of which unnecessary recalibration processes are also partially triggered.

The profile of the motor current after the renewed switching on of the brake motor can therefore occur in different ways depending on the operating state of the parking brake system. Hitherto, the operating state of the parking brake system during the triggering of the recalibration has not been taken into account with the result that unnecessary recalibration processes are frequently incurred. In the prior art, the selected threshold value consequently constitutes a compromise between the detection of a load-free release state of the parking brake and unnecessary starting of a recalibration process of the parking brake.

SUMMARY

The object of the present disclosure is therefore to provide a method for determining a triggering condition for a recalibration process in the case of a load-free release process, which unambiguously detects such a load-free release process of the brake motor and permits triggering of the calibration exclusively when required.

The object is achieved by means of the features of the independent patent claims. Developments of the disclosure are specified in the dependent claims.

A method according to the disclosure serves to determine a triggering condition for recalibration at a predetermined time during a release process of an automatic parking brake which has a brake motor for generating an electromechanical braking force. In the method, according to the disclosure a motor current which is expected at the predetermined time is determined or calculated in advance.

A particular advantage of the present disclosure is that at the predetermined time of a decision about recalibration during the release process of an automatic parking brake, a freely selected compromise value of a motor current is not used as a threshold value. Instead, the motor current which is set at the predetermined time is calculated newly in advance as a triggering condition for each release process. During this calculation, the current operating conditions of the parking brake and, in particular, of the brake motor are taken into account. In this way, the current which is to be theoretically expected at the predetermined time in the case of a load-free release process can be calculated. If the motor current which is actually measured is in the region of the calculated current at the predetermined time, in particular plus a safety threshold, it is possible to assume that the motor current is in the load-free range at this time and the recalibration can be started. Otherwise, recalibration of the parking brake system is not carried out because it can be assumed that the clamping force has not yet been eliminated. The situation of the load-free release can be detected unambiguously in this way, with the result that incorrectly executed recalibration processes can be ruled out. Overall, the calculation of the current, which is expected at the predetermined time, of a load-free release state can be used to determine the triggering condition for recalibration advantageously largely independently of voltage fluctuations of the on-board power system, fluctuations of the motor parameters as a result of production tolerances and of the temperature.

The motor current which is expected at the predetermined time is advantageously used as the triggering condition for recalibration of the parking brake. The triggering condition is preferably defined here in the form of the current which is expected at the predetermined time. For this purpose, it is necessary to perform calculation of the current profile of the release process, which calculation is preferably performed at the start of the release process on the basis of the operating conditions. The current profile is preferably calculated by means of an exponential function with which a release process and the resulting exponential drop in current can be approximated. In contrast to the prior art, a freely selected estimated value is consequently not used as the triggering condition but instead the triggering condition is calculated in a situation-dependent fashion and individually on the basis of the motor parameters. It is therefore not necessary to accept unnecessary recalibration processes any more since said processes are entirely eliminated by the method according to the disclosure.

A method in which the motor current which is expected at the predetermined time is determined on the basis of a maximum current at the start of a switch-on current surge, a no-load current and a time constant, is also particularly advantageous. In particular, in order to determine the triggering condition or the triggering threshold, the maximum current at the start of a switch-on current surge is advantageously determined on the basis of the motor resistance, the motor voltage which is measured at the switch-on time and the no-load current. Using the motor parameters, the no-load current and the voltage which is present at the time of the motor starting, it is possible for the motor current to be determined at the predetermined time which is present in the case of a load-free release state.

The time constant is advantageously determined on the basis of the motor resistance, the motor constants and the mass inertia of the brake motor, in particular of the rotor or armature. By means of the time constants of the brake motor, the triggering condition can be advantageously calculated, specifically the current which is present at the predetermined time in the case of a load-free release.

In order to determine whether the parking brake system is actually in a load-free release state at the predetermined time and consequently recalibration is to take place, the motor current which is expected at the predetermined time is advantageously compared with the actual motor current which is measured at the predetermined time. If the comparison reveals that the measured motor current is in the region of the calculated motor current (triggering condition), it is possible to assume that the system is actually in a load-free release state in which the clamping force of the brake piston has been completely eliminated.

The motor current which is calculated in advance plus a safety threshold is advantageously compared at the predetermined time with the actual motor current. In this way, an incorrect decision at the predetermined time is avoided if the measured current deviates slightly from the calculated current.

Accordingly, recalibration is advantageously not triggered if a motor current which is measured at the predetermined time is above the level of the motor current which is calculated as a triggering condition, in particular plus a safety threshold. If the measured current is specifically above the calculated triggering threshold at the predetermined time, it is possible to assume that the brake linings are still at the brake disk.

The method according to the disclosure runs in a closed-loop or open-loop control unit in a motor vehicle, which control unit can be a component of an automatic parking brake system (APB).

BRIEF DESCRIPTION OF THE DRAWINGS

Further features and expedient aspects of the disclosure emerge from the description of the exemplary embodiments on the basis of the appended figures, in which.

DETAILED DESCRIPTION

Figure 1:
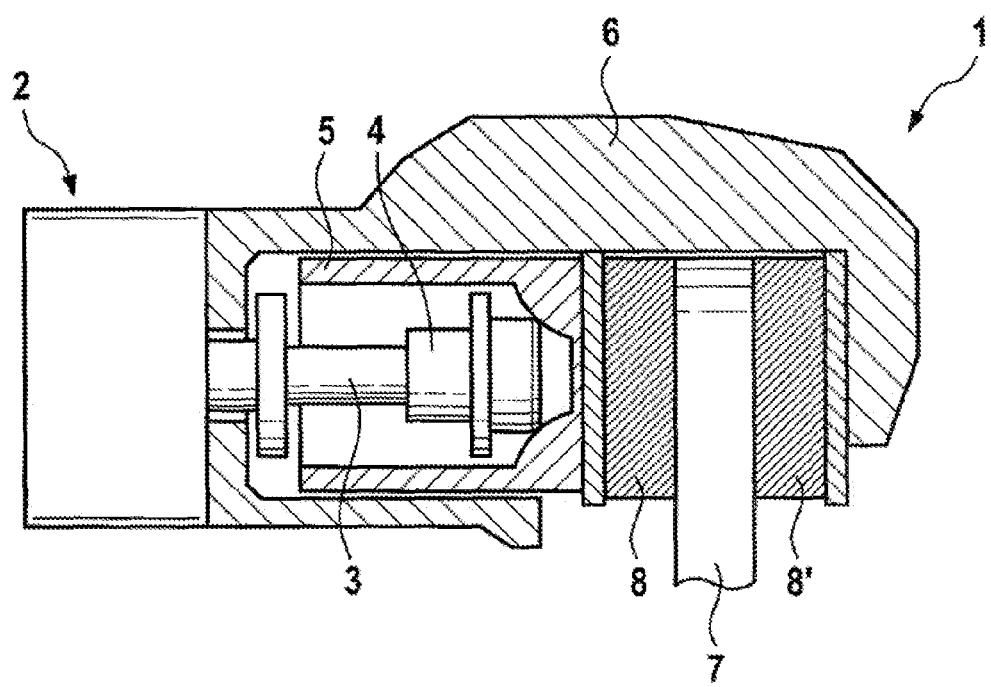
FIG. 1 shows a sectional view through an automatic parking brake for a vehicle having an electric brake motor for generating a clamping force which secures the vehicle.

FIG. 1 shows a sectional view through an electromechanical parking brake (automatic parking brake) 1 for a vehicle, which parking brake can apply, by means of a brake motor 2 which is embodied here as a DC motor, a clamping force for securing the vehicle. The brake motor 2 drives a spindle 3, in particular a threaded spindle, which is mounted in an axial direction. At its end facing away from the brake motor 2, the spindle 3 is provided with a spindle nut 4 which bears against an inner end side or a rear side of a brake piston 5. The spindle nut 4 is moved in the axial direction in the event of a rotational movement of the brake motor 2 and a resulting rotational movement of the spindle 3. The spindle nut 4 and the brake piston 5 are mounted in a brake calliper 6 which engages over a brake disk 7 in the manner of pincers. A brake lining 8, 8' is arranged on each of the two sides of the brake disk 7.

In the case of a brake application process of the automatic parking brake 1, the brake motor 2 rotates, and the spindle nut 4 is subsequently moved in the axial direction toward the brake piston 5 and the brake disk 7 until a predetermined maximum clamping force is achieved. In the case of a release process of the automatic parking brake 1, the brake motor 2 rotates in the opposite direction, with the result that the clamping force is eliminated. In addition to the electromechanical clamping force of the automatic parking brake 1, hydraulic assistance can be provided. In this case, the automatic parking brake 1 is relieved of loading by a fluid pressure which acts on the rear side of the brake piston 5. Accordingly, a release process of the parking brake 1 occurs in this case only with a small elimination of force or entirely without an elimination of force. The brake motor 2 then reaches its load-free release state more quickly, in which release state the clamping force of the automatic parking brake 1 is completely eliminated.

Figure 2:
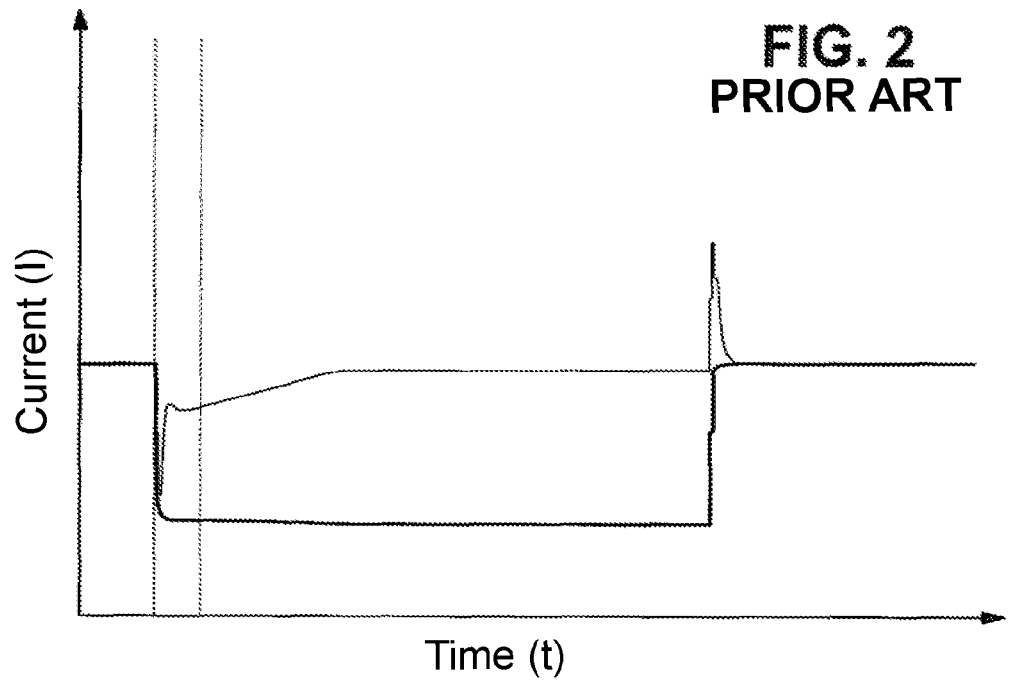
FIG. 2 shows a diagram of a typical current profile when a parking brake is released with the elimination of force.

FIG. 2 shows a diagram of a typical motor current profile, of a release process with elimination of force at room temperature and an applied voltage of approximately U=12 V. A release process with the elimination of force means here that there is no, or only slight, hydraulic assistance of the automatic parking brake 1, with the result that the clamping force is generated electromechanically by the automatic parking brake 1 at least predominantly, and consequently said clamping force has to be eliminated during the release process.

In the case of a fault, described at the beginning, in a release process, the illustrated motor current profile can follow a brake motor 2 being switched on again in order to place the automatic parking brake 1 in a load-free state in which the clamping force is completely eliminated. As is illustrated by the diagram, after the switching on of the motor brake 2, the motor current rises steeply to a negative switch-on motor current peak. Owing to the brake motor 2 whose polarity is reversed for the release process, the motor current is in the negative range here. At the time t=80 ms, selected by way of example, the motor current which is shown in FIG. 2 is still approximately I=−5.2 A.

The current which is picked up by the brake motor 2 subsequently drops until a no-load current $I_L$ is set. During the dropping of the current, the clamping force applied to the brake disk 7 is reduced increasingly until in the no-load state of the brake motor 2 it is completely eliminated and the brake linings 8, 8' are consequently no longer in contact with the brake disk 7.

Figure 3:
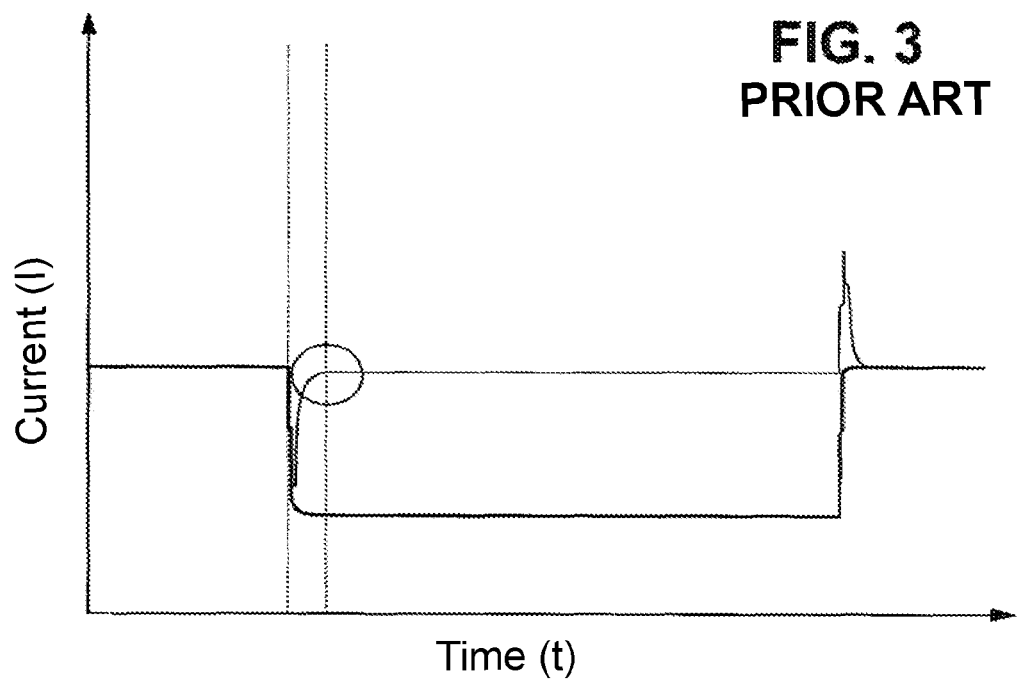
FIG. 3 shows a diagram of a typical current profile when a parking brake is released without the elimination of force at room temperature.

FIG. 3 shows a further diagram which shows a typical current profile during release of the automatic parking brake 1 without an elimination of force. During the release process without the elimination of force there is hydraulic assistance of the automatic parking brake 1 in such a way that a clamping force does not have to be actively eliminated since the latter is generated hydraulically. In the case of the exemplary current profile which is shown in FIG. 3, a release process at room temperature and at an operating voltage of approximately U=12 V was used as the basis.

In the case of the illustrated release without the elimination of force, the current profile also shows a switch-on current peak which, however, goes relatively quickly into the no-load phase of the brake motor 2 owing to the lack of a force elimination phase. The motor current which is picked up at the time t=80 ms is thus still only approximately I=−0.8 A and is therefore far below the current value of the current profile with the elimination of force according to FIG. 2.

Figure 4:
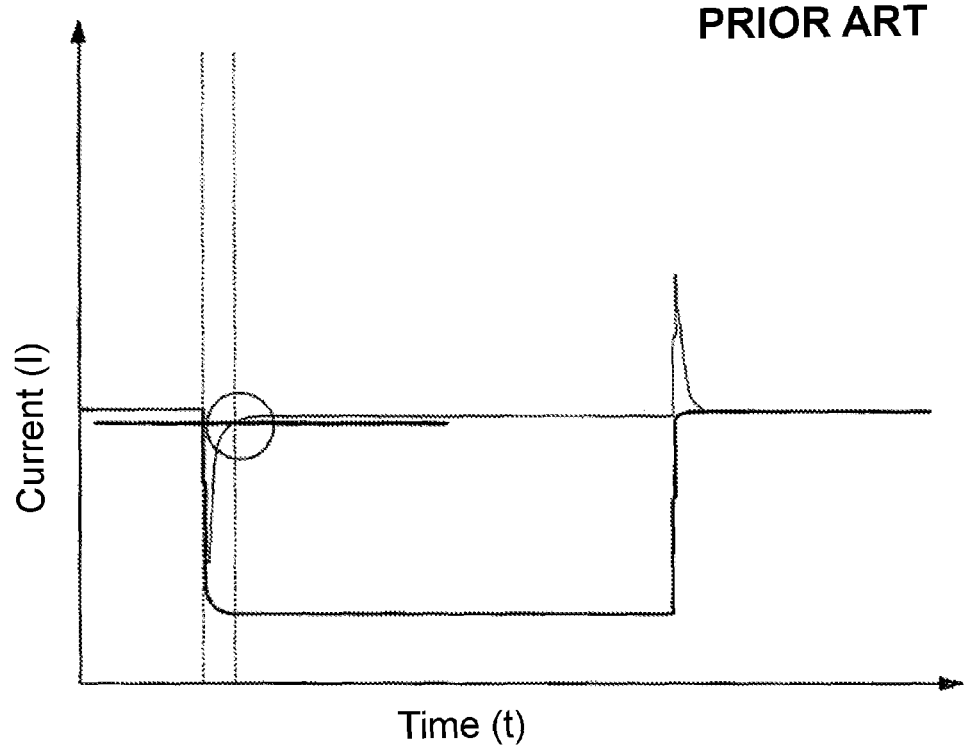
FIG. 4 shows a diagram of a typical current profile when a parking brake is released without the elimination of force at a 90° C. ambient temperature.

In order to clarify how the switch-on current surge of the brake motor 2 has the force elimination curve superimposed on it and how the operating conditions act on the current profile of the brake motor 2, FIG. 4 shows a further diagram of a current profile during a release process without the elimination of force, which is carried out at an ambient temperature of 90° C. and at an operating voltage of U=15 V. Measurement at t=80 ms yields here a motor current of approximately I=−1.36 A.

It is therefore apparent that the high temperature results in a delayed switch-on current surge which leads, at the time t=80 ms, to a higher current value, which, in contrast to the current curve in FIG. 3, is above the no-load current $I_L$ and could be interpreted as a high admission pressure of the driver via the service brake.

Overall, it is therefore apparent that the operating conditions of the parking brake system influence the current profile of the release process. According to the present disclosure, the current which is expected in the load-free release state is determined at the predetermined time $t_0$. The curve profile of the current i(t) which is picked up by the brake motor 2 is determined for this purpose at the start of the release process as a function of the switch-on current surge and the elimination of force. The current profile of a load-free release process is approximated here by means of an exponential function and using the following formula:

$$i(t) = I_{Max} e^{-t/\tau} + I_L$$

Here, i(t) is the calculated motor current at the time t, $I_{Max}$ is the maximum motor current at the start of the switch-on current surge, $\tau$ is the mechanical time constant of the brake motor 2, and $I_L$ is the no-load current which is set in the load-free state. The motor current $I_{Max}$ at the start of the switch-on current surge is calculated as follows here:

$$I_{Max} = \frac{U_{Mot}}{R_{Mot}} - I_L$$

Here, $U_{Mot}$ is the voltage of the brake motor 2 which is measured at the switch-on time, $R_{Mot}$ is the motor resistance and $I_L$ is the no-load current which must be firstly subtracted for the estimation of the switch-on current $I_{Max}$. The mechanical time constant $\tau$ is determined by means of the motor resistance $R_{Mot}$, the motor constants $K_{Mot}$ and the mass inertia J of the brake motor armature, as follows:

$$\tau = \frac{R_{Mot} \cdot J}{K_{Mot}^2}$$

In order to be able to carry out the calculation of the current profile i(t), the motor resistance $R_{Mot}$, the motor constant $K_{Mot}$ and the no-load current $I_L$ must firstly be determined. The determination of these parameters is known from the prior art. The motor constant $K_{Mot}$ and the motor resistance $R_{Mot}$ are therefore determined from relationships, known per se, from the current values of the motor current U, of the motor current I and the motor rotational speed, which are preferably determined during the running up of the engine directly after the start of the brake motor 2. The no-load current $I_L$ is determined in the phase after the switch-on current surge of the brake motor 2, in which phase the rotation speed of the brake motor 2 is constant and the no-load current $I_L$ is determined only by the load or by the friction of the brake motor 2.

The profile of the current i(t) which is picked up by the brake motor 2 during a release process is therefore determined on the basis of a superimposition or a joint consideration of the switch-on peak $I_{Max}$ and the elimination of force, represented by the mechanical time constant $\tau$ of the brake motor 2. The profile of the motor current i(t) is adjusted or calculated in advance here using an exponential function.

Overall, the following procedure is obtained for the calculation in advance of the current at a predetermined time $t_0$: the motor parameters $R_{Mot}$ and $K_{Mot}$ and the no-load current $I_L$ are determined. The current $I_{Max}$ can subsequently be calculated at the start of the switch-on current surge using the motor voltage $U_{Mot}$ measured at the starting time of the brake motor 2. When this current is determined, the simplification of assuming a system of the first order is sufficient. The inductance of the brake motor 2 can be ignored because the measuring time is significantly longer than the expected time constant $\tau$, and owing to the fact that at high temperatures the mechanical time constant $\tau$ is very much greater than the electrical time constant. The expected current i at the predetermined time $t_0$, which forms the time for the determination of the load-free release, is determined using the exponential function. In order to calculate the current profile i(t), the no-load current $I_L$ must be added again.

At the predetermined time of the determination of the load-free release, for example after $t_0=80$ ms, the calculated current $i(t_0)$ is compared with the current $I_{Mot}$ which is measured at this predetermined time $t_0$. For this purpose, a safety threshold is preferably applied which is added to or subtracted from the calculated value. If the comparison reveals that the measured current is at the level of $i(t_0)$, it can be assumed that the automatic parking brake 1 is in the state of load-free release at the predetermined time $t_0$, and the recalibration can be initiated. If, on the other hand, the current which is measured at the predetermined time $t_0$ is above the calculated current value $i(t_0)$, it can be assumed that the brake linings 8, 8' are still on the brake disk 7, and the clamping force has consequently not yet been eliminated.

Overall, it therefore becomes apparent that the present disclosure calculates a triggering condition individually as a function of the operating conditions of the parking brake 1 in the form of the current i which is to be expected at the predetermined time $t_0$. The triggering condition is in this way largely independent of voltage fluctuations in the on-board power system, fluctuations in the motor parameters as a result of production tolerances and of the temperature. Recalibration is in this way initiated only when it is actually necessary.

A comparison of the measured current with the calculated expected current $i(t_0)$ can, furthermore, take place not only at a predetermined time $t_0$ but at one or more additional subsequent predetermined times $t_1$, $t_2$, etc. In particular, after a time period a renewed comparison with the measured current can take place, for example at a time $t_1$.

The calculation of the expected current profile and the comparison of an expected current at a predetermined time $t_0$ is preferably implemented by programming technology in a control unit. In this context, the current values, voltage values and rotational speed values which are acquired by means of a suitable measuring device are preferably evaluated in the way described above. The control unit can be a stand-alone control unit of the automatic parking brake system 1 or an existing control unit of a vehicle movement dynamics system such as ESP (electronic stability program) or the like.

Furthermore, it is to be noted that the present disclosure can be used in various types of parking brake systems. Basically, the method according to the disclosure can be applied for all known automatic parking brakes which comprise an electromechanical locking mechanism which is located on the wheel brake and which have current and voltage measuring technology on the brake motor 2.

What is claimed is:

1. A method for operating a brake system comprising:
   determining, with a control unit, maximum motor current expected through a brake motor in the brake system at a predetermined time based on the following formula: $I_{Max}(e^{-t/\tau})+I_L$ where $I_{Max}$ is a predetermined maximum current at a start of a switch-on current surge for activation of the brake motor, t is the predetermined time, $\tau$ is predetermined mechanical time constant of the brake motor, and $I_L$ is a predetermined no-load current through the brake motor;
   supplying electrical power to the brake motor for a time period being prior to the predetermined time and continuing through the predetermined time;
   measuring an actual motor current through the brake motor at the predetermined time; and
   triggering, with the control unit, a recalibration process for the brake motor only in response to the actual motor current being less than the maximum motor current expected at the predetermined time.

2. The method according to claim 1, further comprising:
   determining, with the control unit, the time constant on the basis of a motor resistance, motor constants, and a mass inertia of the brake motor.

3. The method according to claim 1, further comprising:
   triggering, with the control unit, the recalibration process for the brake motor only in response to the actual motor current being less than a sum of the maximum motor current expected at the predetermined time and a predetermined safety threshold current.

4. The method according to claim 1, further comprising:
   determining, with the control unit, the time constant on the basis of a motor resistance, motor constants, and an armature of the brake motor.

5. A brake system comprising:
   a brake motor; and
   a control unit operatively connected to the brake motor, the control unit being configured to:
      determine a maximum motor current expected through a brake motor in the brake system at a predetermined time based on the following formula: $I_{Max}(e^{-t/\tau})+I_L$ where $I_{Max}$ is a predetermined maximum current at a start of a switch-on current surge for activation of the brake motor, t is the predetermined time, $\tau$ is predetermined mechanical time constant of the brake motor, and $I_L$ is a predetermined no-load current through the brake motor:
      supply electrical power to the brake motor for a time period being prior to the predetermined time and continuing through the predetermined time:
      measure an actual motor current through the brake motor at the predetermined time; and
      trigger a recalibration process for the brake motor only in response to the actual motor current being less than the maximum motor current expected at the predetermined time.

6. The brake system of claim 5, the control unit being further configured to: trigger the recalibration process for the brake motor only in response to the actual motor current being less than a sum of the maximum motor current expected at the predetermined time and a predetermined safety threshold current.

* * * * *